(12) United States Patent
Gilliland et al.

(10) Patent No.: US 9,204,531 B2
(45) Date of Patent: Dec. 1, 2015

(54) IMPLEMENTING FEED-THROUGH AND DOMAIN ISOLATION USING FERRITE AND CONTAINMENT BARRIERS

(75) Inventors: Don A. Gilliland, Rochester, MN (US); Dennis J. Wurth, Rochester, MN (US)

(73) Assignee: International Business Machines Corporation, Armonk, NY (US)

(*) Notice: Subject to any disclaimer, the term of this patent is extended or adjusted under 35 U.S.C. 154(b) by 634 days.

(21) Appl. No.: 13/495,372

(22) Filed: Jun. 13, 2012

(65) Prior Publication Data

US 2013/0333928 A1    Dec. 19, 2013

(51) Int. Cl.
| H05K 1/16 | (2006.01) |
| H05K 1/11 | (2006.01) |
| H05K 1/14 | (2006.01) |
| H05K 7/00 | (2006.01) |
| H01R 13/66 | (2006.01) |
| H05K 1/02 | (2006.01) |

(52) U.S. Cl.
CPC ............ *H05K 1/0231* (2013.01); *H05K 1/0233* (2013.01); *H05K 1/11* (2013.01); *H05K 2201/086* (2013.01); *H05K 2201/09972* (2013.01); *Y10T 29/49155* (2015.01)

(58) Field of Classification Search
USPC .......................... 174/257, 258, 260, 261, 266; 439/620.05, 620.06, 620.07, 620.12, 439/620.13, 620.16
See application file for complete search history.

(56) References Cited

U.S. PATENT DOCUMENTS

| 3,895,266 | A | * | 7/1975 | Geiger ........................... 361/785 |
| 4,569,000 | A | * | 2/1986 | Noji .............................. 361/816 |
| 4,743,868 | A | * | 5/1988 | Katoh et al. ................... 361/783 |
| 4,796,079 | A | | 1/1989 | Hettiger |
| 5,031,073 | A | * | 7/1991 | Chang ............................ 361/778 |
| 5,131,140 | A | * | 7/1992 | Zimmer ......................... 361/777 |
| 5,165,055 | A | * | 11/1992 | Metsler .......................... 361/818 |
| 5,562,498 | A | * | 10/1996 | Brandenburg et al. .. 439/620.09 |
| 5,568,111 | A | | 10/1996 | Metsler |
| 5,621,363 | A | * | 4/1997 | Ogden et al. .................. 361/818 |
| 6,037,846 | A | * | 3/2000 | Oberhammer ................ 361/818 |
| 6,125,044 | A | | 9/2000 | Cherniski et al. |
| 6,407,931 | B1 | * | 6/2002 | Yonce et al. ................... 361/816 |
| 6,483,394 | B2 | | 11/2002 | Kim |
| 6,507,495 | B1 | * | 1/2003 | Hailey et al. .................. 361/748 |
| 6,906,910 | B1 | * | 6/2005 | Gilliland et al. .............. 361/328 |

(Continued)

OTHER PUBLICATIONS

Duffy, Maeve, et al., "Improved Shielding Performance Using High Permeability Electroplated Thin Films in Printed Circuit Boards", IEEE Transactions on Magnetics, vol. 47, No. 10, Oct. 2011, pp. 4282-4285.

*Primary Examiner* — Chau N Nguyen
*Assistant Examiner* — Roshn Varghese
(74) *Attorney, Agent, or Firm* — Joan Pennington

(57) ABSTRACT

Methods and structures are provided for implementing feed-through and domain isolation using ferrite and containment barriers. A vertical isolator is provided between a first domain and a second domain on a printed circuit board with signals passing between the first domain and the second domain. The vertical isolator is placed over a domain separation gap between the first and second domains in the printed circuit board, the vertical isolator having a vertical isolation barrier between a first vertical plate coupled to the first domain and a second vertical plate coupled to the second domain. The vertical isolation barrier is formed of a unitary ferrite block or a non-conductive magnetic absorber material. A plurality of capacitance feed-through plates and a dielectric material are provided within the vertical isolator.

20 Claims, 4 Drawing Sheets

(56) References Cited

U.S. PATENT DOCUMENTS

| | | |
|---|---|---|
| 6,997,747 B1 * | 2/2006 | Norte et al. ............. 439/607.01 |
| 7,204,701 B1 | 4/2007 | Balasingham et al. |
| 7,544,064 B2 | 6/2009 | Gilliland |
| 7,939,766 B2 * | 5/2011 | Anderson et al. ............. 361/816 |
| 7,994,435 B2 * | 8/2011 | Kato et al. ............. 361/704 |
| 2006/0272857 A1 * | 12/2006 | Arnold ............. 361/816 |
| 2007/0216492 A1 * | 9/2007 | Kawanami ............. 333/24.2 |
| 2008/0278921 A1 * | 11/2008 | Shin et al. ............. 361/761 |
| 2011/0149538 A1 | 6/2011 | Cui et al. |

\* cited by examiner

IMPLEMENTING FEED-THROUGH AND DOMAIN ISOLATION USING FERRITE AND CONTAINMENT BARRIERS

FIELD OF THE INVENTION

The present invention relates generally to the data processing field, and more particularly, relates to methods and structures for implementing feed-through and domain isolation using ferrite and containment barriers.

DESCRIPTION OF THE RELATED ART

As used in the present specification and claims, the terms circuit board, printed circuit board or PCB means a substrate or multiple layers (multi-layer) of substrates used to electrically attach electrical components and should be understood to generally include circuit cards, printed circuit cards, backplanes, printed wiring cards, printed wiring boards, flex circuits, and ceramic or organic chip packaging substrates.

A need exists to provide effective separation of domains on a printed circuit board. Conventional arrangements for separation of domains often fail to provide effective isolation due to the fringe capacitive coupling between domains.

At higher frequencies the domains can act as patch antennas coupling electromagnetically between sections on a board hindering isolation. Isolation is important in mixed technology boards, for example, analog and digital, or between sections operating at different frequencies where interference between the two entities would be a problem.

This interference problem occurs routinely on the same platform, for example, a laptop that has both digital modules for display, and the like, and the electronics needed for wireless communication. A need exists to provide isolation for secure signal containment at the board level to prevent plaintext signals from emanating into an unsecured signal section of the board.

SUMMARY OF THE INVENTION

Principal aspects of the present invention are to provide methods and structures for implementing feed-through and domain isolation using ferrite and containment barriers. Other important aspects of the present invention are to provide such methods and structures substantially without negative effects and that overcome many of the disadvantages of prior art arrangements.

In brief, methods and structures are provided for implementing feed-through and domain isolation using ferrite and containment barriers. A vertical isolator is provided between a first domain and a second domain on a printed circuit board with signals passing between the first domain and the second domain. The vertical isolator is placed over a domain separation gap between the first and second domains in the printed circuit board, the vertical isolator having a vertical isolation barrier between a first vertical plate coupled to the first domain and a second vertical plate coupled to the second domain.

In accordance with features of the invention, the vertical isolation barrier includes a unitary ferrite block. The vertical isolation barrier alternately includes a laminated absorber material, for example, including a flexible, thin, non-conductive magnetic material, a carbon filled plastic, or a magnetic powder encapsulated or injection molded in a flexible polymer.

In accordance with features of the invention, the vertical isolator includes a plurality of capacitance feed-through plates, for example, provided on opposed sides of both the first vertical plate and the second vertical plate proximate to a signal net feed-through extending through the vertical isolator. A dielectric material is provided within the vertical isolator with a number of the capacitance feed-through plates and the plate area being selectively provided for a capacitance value. The dielectric material is a typical circuit board dielectric, such as, a thin FR4 dielectric, polyimide, alumina or aluminum oxide (Al2O3).

In accordance with features of the invention, the vertical isolator is mounted across the domain separation gap with the vertical isolation barrier disposed over the domain separation gap.

In accordance with features of the invention, the first vertical plate coupled to the first domain and the second vertical plate coupled to the second domain includes a barrier slot for receiving a connection to extend a containment barrier above and over the contained modules in one of or both the first domain and the second domain.

In accordance with features of the invention, the first vertical plate and the second vertical plate are formed of a selected material from a group including copper, copper plated with nickel, and aluminum.

In accordance with features of the invention, the vertical isolator includes a containment barrier formed of a selected material from a group including tin plated steel, nickel plated copper, stainless steel, and aluminum.

In accordance with features of the invention, the vertical isolator provides improved isolation for secure signal containment at the board level to prevent plaintext signals from emanating into the unsecured signal section of the board.

BRIEF DESCRIPTION OF THE DRAWINGS

The present invention together with the above and other objects and advantages may best be understood from the following detailed description of the preferred embodiments of the invention illustrated in the drawings, wherein.

DETAILED DESCRIPTION OF THE PREFERRED EMBODIMENTS

Figure 1:
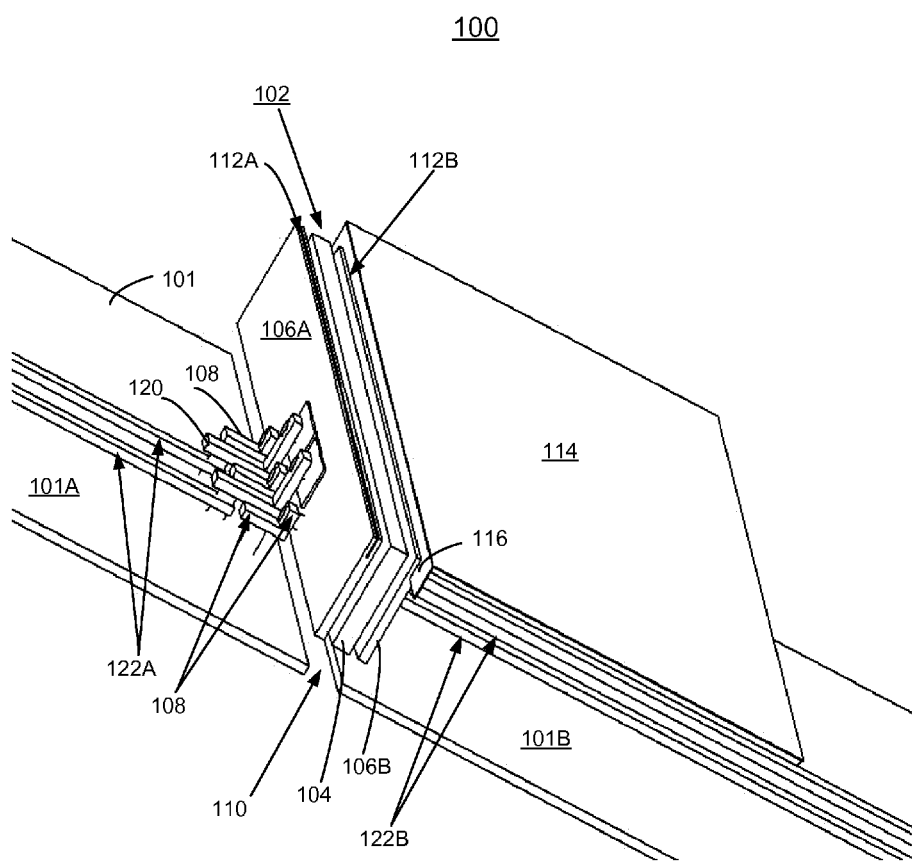
FIG. 1 is a perspective view not to scale schematically illustrating an example vertical isolation structure for implementing feed-through and domain isolation using ferrite and containment barriers in accordance with a preferred embodiment.
Figure 2:
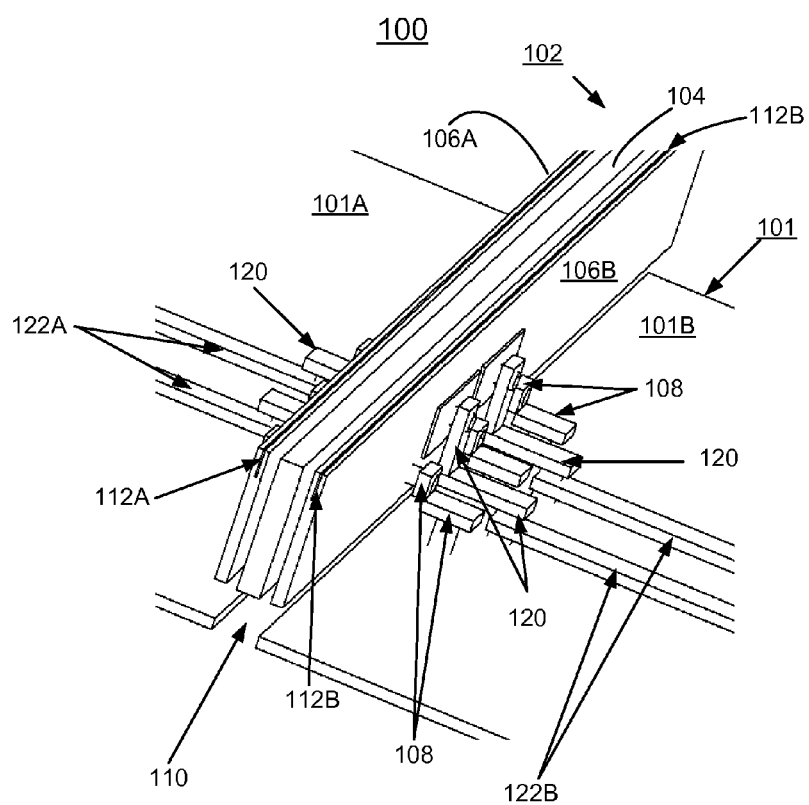
FIG. 2 is a fragmentary perspective view not to scale schematically illustrating the structure of FIG. 1 with a containment barrier removed in accordance with a preferred embodiment.

In the following detailed description of embodiments of the invention, reference is made to the accompanying drawings, which illustrate example embodiments by which the invention may be practiced. It is to be understood that other embodiments may be utilized and structural changes may be made without departing from the scope of the invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

In accordance with features of the invention, methods and structures are provided for implementing feed-through and domain isolation using ferrite and containment barriers with some signals passing from one domain to another, such as low frequency control signals across an RF or digital region. A vertical isolator uses vertical space to form an isolation barrier with circuit board domain references separated by a ferrite barrier. The vertical isolator forms an isolation barrier for secure signal containment at circuit board domains to prevent plaintext signals from emanating into an unsecured signal section of the board. The circuit board domains form a reference by which the signals pass through the domains. Noise that is on the signal lines in the respective circuit board domains is decoupled to its initial reference plane in order to keep the noise contained within the circuit board domain, while a band passed signal is routed to the other domain by a signal net feed-though. With the vertical isolator of the invention, circuit board domains are referenced allowing noise current to remain within each respective domain, as well providing ferrite domain isolation.

Referring now to FIGS. 1-4, there are shown an example vertical isolation structure for implementing feed-through and domain isolation using ferrite and containment barriers generally designated by the reference character 100 in accordance with preferred embodiments.

Figure 3:
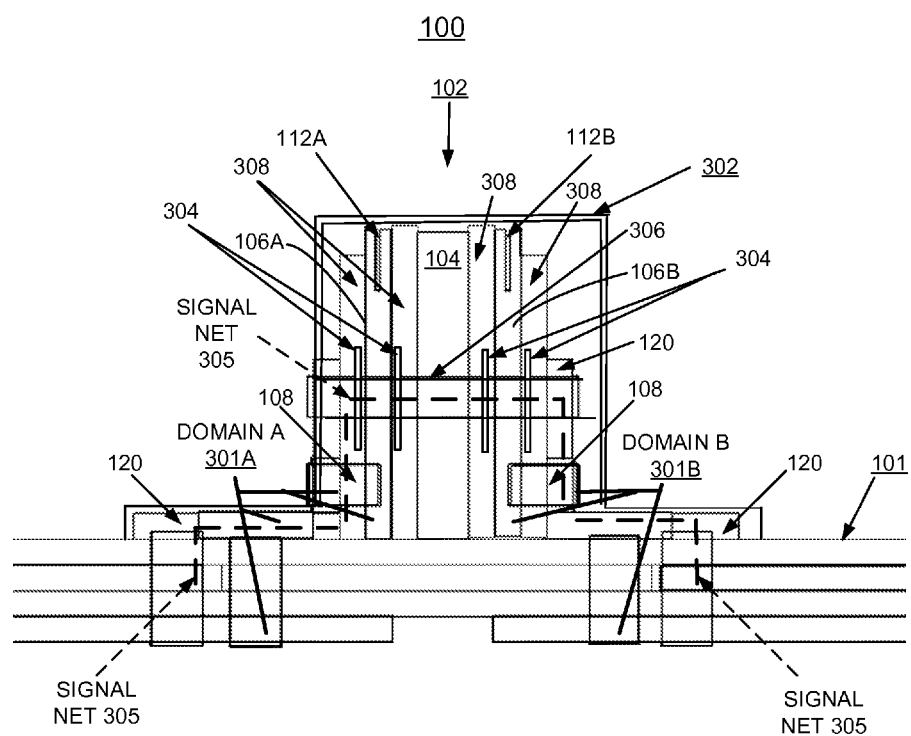
FIG. 3 is a fragmentary side view not to scale schematically illustrating structure of FIG. 1 with another containment barrier in accordance with a preferred embodiment.
Figure 4:
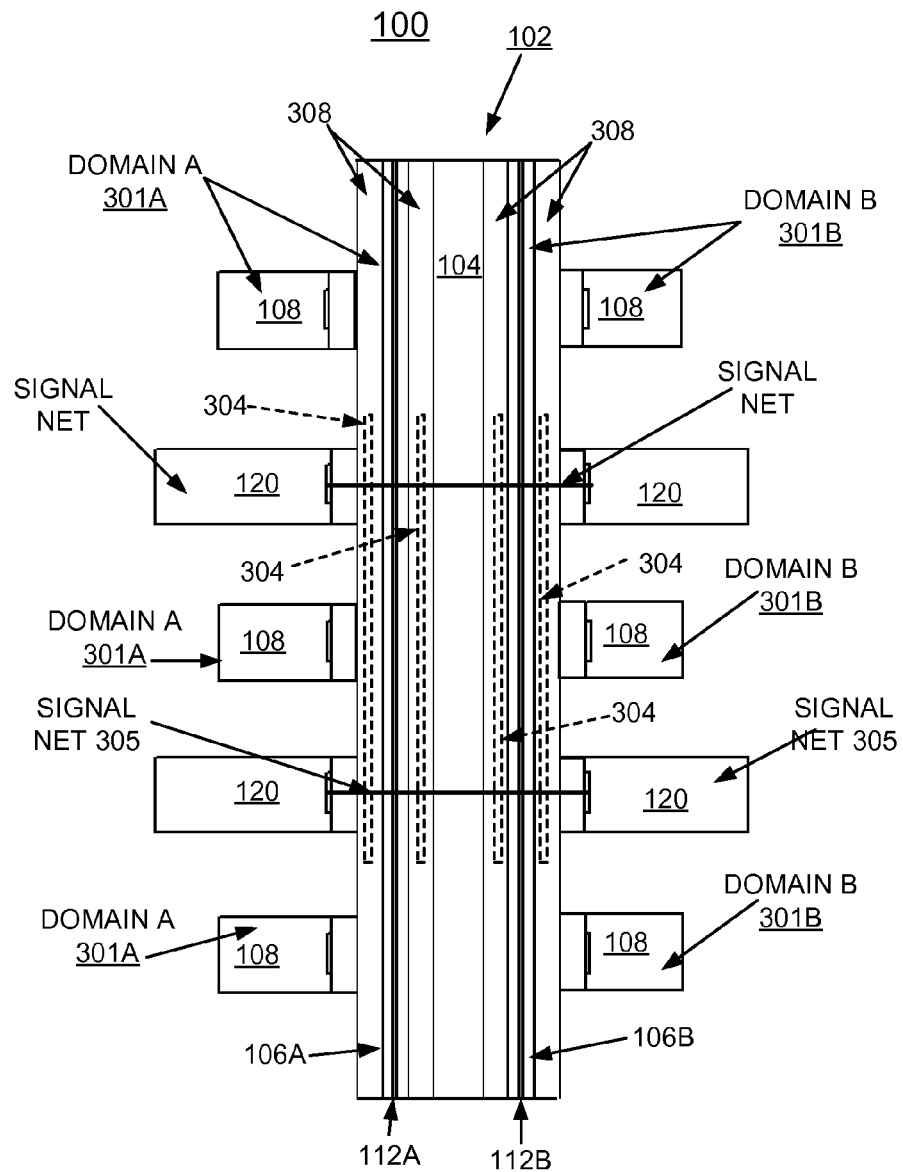
FIG. 4 is a fragmentary plan view not to scale schematically illustrating structure of FIG. 1 with interior detail capacitance plate shown in dotted line and signal net schematically shown in accordance with a preferred embodiment.

Vertical isolation structure 100 includes a vertical isolator generally designated by the reference character 102 provided between a printed circuit board first domain 101A, and a printed circuit board second domain 101B on a printed circuit board 101 with signals passing between the first domain and the second domain, such as indicated by the lines labeled SIGNAL NET in FIGS. 3 and 4. The vertical isolator 102 includes a vertical isolation barrier 104 disposed between a first vertical plate 106A coupled to the first domain 101A and a second vertical plate 106B coupled to the second domain 101B.

The vertical isolation barrier 104 includes, for example, a unitary ferrite block. The vertical isolation barrier 104 optionally is formed of a non-conductive magnetic absorber material, such as a laminated absorber material, for example, including a flexible, thin, non-conductive magnetic material member, a carbon filled plastic, or a magnetic powder encapsulated or injection molded in a flexible polymer, such as TPE or urethane.

A plurality of respective angled domain attachment connectors 108 respectively connects the vertical plates 106A, 106B to the printed circuit board first domain 101A and a second vertical plate 106B, such as indicated by the lines labeled DOMAIN A, 301A and DOMAIN B, 301B in FIG. 3.

The vertical isolator 102 is surface mounted to the printed circuit board first domain 101A and a second vertical plate 106B with the angled domain attachment connectors 108. The isolation barrier 104 is generally centrally disposed over a domain separation gap 110 provided between the first and second domains 101A, 101B in the printed circuit board 101.

Each of the first vertical plate 106A and the second vertical plate 106B includes a respective barrier slot 112A, 112B enabling a connection to a respective containment barrier, for example extending above and over contained modules in one of or both the first domain and the second domain 101A, 101B.

As shown in FIG. 1, a containment barrier 114 having a mating connection 116 that is received within barrier slot 112B of the second vertical plate 106B. The containment barrier 114, for example, extends over modules (not shown) of the second domain 101B. For displacement current containment barrier 114 provides a return path for energy that might escape the area. With additional fixturing to the board, substantially full electromagnetic compatibility (EMC) or electromagnetic interference (EMI) containment of interfering signals is possible utilizing a low impedance connection to the proper domain 101A, 101B.

A full containment could be in the form of one or more containment barriers 114 provided with the vertical isolator 102 surrounding a circuit or area of a circuit board 101 such that a cover could be fitted into all barrier slots 112A, 112B to enclose the isolated area. If the vertical isolator 102 did not fully surround the isolated area, the walls of containment barriers 114 could extend down to the PCB 101 for connection to the isolation reference directly or through shunt wall components with a similar barrier slot, as the barrier slots 112A, 112B. The barrier slots barrier slots 112A, 112B could also be extended down the sides of the domain plates 106A, 106B to allow for a connector plate (not shown) to slide in place and connect one isolator 102 to another adjacent isolator 102. Any isolator 102 could be placed at any angle with respect to the adjacent one.

A respective pair of angled attachment connectors 120 respectively connects signal lines 122A, 122B respectively carried by the printed circuit board first domain 101A and the printed circuit board second domain 101B, for example, as indicated by the lines labeled SIGNAL NET in FIGS. 3 and 4.

Referring now to FIGS. 3 and 4, respective connections to domain A and domain A with the printed circuit board 101, the angled domain attachment connectors 108, first vertical plate 106A and the second vertical plate 106B are indicated by lines labeled DOMAIN A, 301A and DOMAIN B, 301B, as shown in FIG. 3. The vertical isolator structure 100 includes an example housing or containment cover 302 extending over the vertical isolator 102 including the isolation barrier 104, and plates 106A, 106B, and portions of DOMAIN A, 301A and DOMAIN B, 301B, as shown in FIG. 3.

As shown in FIG. 3, the vertical isolator structure 100 includes a plurality of capacitance feed-through plates 304, for example, provided on opposed sides of both the first vertical plate 106A, and the second vertical plate 106B proximate to a signal net feed-through 305 extending through the vertical isolator 102. The capacitance feed-through plates 304 are shown in dotted line in FIG. 4 with a signal net feed-through 305 schematically shown by a line labeled SIGNAL NET 305. A dielectric material 308 is provided within the vertical isolator 102 with a number of the capacitance feed-through plates 304 and the plate area being selectively provided for a desired capacitance value. The dielectric material 308 is a typical circuit board dielectric, such as, a thin FR4 dielectric, polyimide, alumina or aluminum oxide (Al2O3).

The vertical isolator structure 100 forms an isolation barrier with printed circuit board domain references separated by the isolation barrier 104. Signals that cross the gap 110 between the first domain 101A and the second domain 101B of FIG. 1, and DOMAIN A, 301A and DOMAIN B, 301B, as shown in FIG. 3 must traverse through capacitance defined by the capacitance feed-through plates 304 and dielectric 308 including a first capacitance to the first domain A, a second capacitance to the first domain A, a series ferrite block 104 providing lossy impedance, and a third capacitance to the second domain B, and a fourth capacitance to the second domain B.

It should be understood that the vertical isolator structure 100 is not limited to the illustrated isolation barrier 104 and the capacitance feed-through plates 304. A selected number of isolation barriers 104 and capacitance feed-through plates 304 advantageously are provided to obtain a level of feed through isolation required in accordance with the present invention.

A material forming containment barrier 114 of FIG. 1 generally includes any common barrier material used for shielding, for example, tin plated steel, nickel plated copper, stainless steel, or aluminum. The two plates 106A, 106B on the opposite sides of ferrite barrier 104 can be formed of, for example, copper, plated copper with nickel Ni, aluminum or the like.

The vertical isolation barrier 104 can be formed, for example, with various non-conductive magnetic absorber materials manufactured and sold by ARC Technologies, Inc. of Amesbury, Mass. 01913 USA. The isolation barrier 104 can be formed of, for example, any solid typical ferrite such as NiZn 42 or other absorber material that displays a flexible property, and having typical dimensions on absorber thickness with a thickness/gap of ~1 mm, height ~6 mm, and length determined by a particular application. The angled domain attachment connectors 108 and the angled connectors 120 include typical pin in hole pins for circuit board with 6 mm wire diameter typical, and ground and circuit board attachment is made through board vias, 0.33 mm diameter minimum, with typical dimensions determined by a particular board technology.

While the present invention has been described with reference to the details of the embodiments of the invention shown in the drawing, these details are not intended to limit the scope of the invention as claimed in the appended claims.

What is claimed is:

1. A structure for implementing domain isolation in a printed circuit board comprising:
    a vertical isolator and a containment barrier provided with a printed circuit board, said vertical isolator coupled between a first domain and a second domain on the printed circuit board with at least one signal net passing between the first domain and the second domain;
    said vertical isolator extending over a domain separation gap between the first and second domains in the printed circuit board;
    said vertical isolator including a vertical isolation barrier disposed between a first vertical plate coupled to the first domain and a second vertical plate coupled to the second domain, said vertical isolator barrier formed by an electrically non-conductive material; said first vertical plate and said second vertical plate formed of electrically conductive material; and
    said vertical isolator and said containment barrier providing domain isolation in the printed circuit board, said vertical isolator and said containment barrier providing secure signal containment isolation to prevent plaintext signals from emanating between the first domain and the second domain on the printed circuit board, and said at least one signal net routing a signal passing between the first domain and the second domain.

2. The structure as recited in claim 1 wherein said vertical isolation barrier includes a ferrite block.

3. The structure as recited in claim 1 wherein said vertical isolation barrier includes a non-conductive magnetic absorber material.

4. The structure as recited in claim 1 includes a plurality of capacitance feed-through plates and a dielectric material provided within the vertical isolator proximate to opposed sides of both said first vertical plate and said second vertical plate.

5. The structure as recited in claim 4 includes a signal net feed-through extending through the vertical isolator and wherein said plurality of capacitance feed-through plates and said dielectric material are provided proximate to said signal net feed-through.

6. The structure as recited in claim 5 wherein said dielectric material includes a selected circuit board dielectric from a group including a FR4 dielectric, polyimide, alumina and aluminum oxide (Al2O3).

7. The structure as recited in claim 1 wherein each of said first vertical plate coupled to the first domain and said second vertical plate coupled to the second domain includes a barrier slot for receiving a connection to said containment barrier above and over the contained modules in one of or both the first domain and the second domain.

8. The structure as recited in claim 7 wherein said containment barrier is formed of a selected material from a group including tin plated steel, nickel plated copper, stainless steel, and aluminum.

9. The structure as recited in claim 7 wherein said first vertical plate and said second vertical plate are formed of a selected material from a group including copper, copper plated with nickel, and aluminum.

10. The structure as recited in claim 1 wherein said vertical isolation barrier is disposed over said domain separation gap between the first and second domains of the printed circuit board.

11. A method for implementing domain isolation in a printed circuit board comprising:
    providing domain isolation in a printed circuit board including a containment barrier and a vertical isolator coupled between a first domain and a second domain on a printed circuit board with at least one signal net passing between the first domain and the second domain;
    providing a domain separation gap between the first and second domains in the printed circuit board;
    mounting said vertical isolator extending over said domain separation gap; and
    providing said vertical isolator with a vertical isolation barrier disposed between a first vertical plate coupled to the first domain and a second vertical plate coupled to the second domain, said vertical isolator barrier formed by an electrically non-conductive material, said first vertical plate and said second vertical plate formed of electrically conductive material; and
    said vertical isolator and said containment barrier providing domain isolation in the printed circuit board, said vertical isolator and said containment barrier providing secure signal containment isolation to prevent plaintext signals from emanating between the first domain and the second domain on the printed circuit board, and said at least one signal net routing a signal passing between the first domain and the second domain.

12. The method as recited in claim 11 providing said vertical isolator includes providing a plurality of capacitance feed-through plates and a dielectric material provided within the vertical isolator proximate to opposed sides of both said first vertical plate and said second vertical plate.

13. The method as recited in claim 12 includes providing a signal net feed-through extending through the vertical isolator and wherein said plurality of capacitance feed-through plates and said dielectric material are provided proximate to said signal net feed-through.

14. The method as recited in claim 12 wherein said dielectric material includes a selected circuit board dielectric from a group including a FR4 dielectric, polyimide, alumina and aluminum oxide (Al2O3).

15. The method as recited in claim 11 wherein each of said first vertical plate coupled to the first domain and said second vertical plate coupled to the second domain includes a barrier slot for receiving a connection to said containment barrier above and over the contained modules in one of or both the first domain and the second domain.

16. The method as recited in claim 15 wherein said containment barrier is formed of a selected material from a group including tin plated steel, nickel plated copper, stainless steel, and aluminum.

17. The method as recited in claim 11 wherein said first vertical plate and said second vertical plate are formed of a selected material from a group including copper, copper plated with nickel, and aluminum.

18. The method as recited in claim 11 wherein providing said vertical isolator includes implementing said vertical isolation barrier with a ferrite block.

19. The method as recited in claim 11 wherein providing said vertical isolator includes forming said vertical isolation barrier with a non-conductive magnetic absorber material.

20. The method as recited in claim 11 wherein mounting said vertical isolator extending over said domain separation gap includes providing said vertical isolation barrier located over said domain separation gap between the first and second domains of the printed circuit board.

* * * * *